(12) United States Patent
Song et al.

(10) Patent No.: US 8,057,084 B2
(45) Date of Patent: Nov. 15, 2011

(54) SIDE-VIEW TYPE LIGHT EMITTING DEVICE AND OPTICAL DEVICE INCLUDING THE SAME

(75) Inventors: Ho Young Song, Gyunggi-do (KR); Won Soo Ji, Gyunggi-do (KR); Won Ho Jung, Chungcheongnam-do (KR); Young Jin Cho, Seoul (KR); Hyun Kyung Kim, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 421 days.

(21) Appl. No.: 12/397,893

(22) Filed: Mar. 4, 2009

(65) Prior Publication Data
US 2010/0085772 A1 Apr. 8, 2010

(30) Foreign Application Priority Data
Oct. 8, 2008 (KR) .................. 10-2008-0098637

(51) Int. Cl.
*F21V 17/00* (2006.01)
(52) U.S. Cl. ........................................ 362/612; 362/632
(58) Field of Classification Search .................. 362/612, 362/632, 634; 257/98, 99, 100, E33.058, 257/E33.061
See application file for complete search history.

(56) References Cited

U.S. PATENT DOCUMENTS

| 5,498,883 | A * | 3/1996 | Lebby et al. ..................... 257/95 |
| 7,238,967 | B2 * | 7/2007 | Kuwabara et al. ............... 257/98 |
| 2006/0198147 | A1 * | 9/2006 | Ge ................................. 362/294 |
| 2007/0267643 | A1 * | 11/2007 | Harada et al. .................... 257/98 |

FOREIGN PATENT DOCUMENTS
KR  10-2004-0022177 A  3/2004
* cited by examiner

*Primary Examiner* — David V Bruce
(74) *Attorney, Agent, or Firm* — McDermott Will & Emery LLP

(57) ABSTRACT

A side-view type light emitting device includes a package body, first and second lead frames, a light emitting diode chip, a resin covering portion, and at least one spacer portion. The package body has a first surface provided as a mounting surface, a second surface located opposite to the first surface, side surfaces located between the first surface and the second surface, and a concave portion formed at one of the side surfaces corresponding to the light emitting surface.

15 Claims, 10 Drawing Sheets

SIDE-VIEW TYPE LIGHT EMITTING DEVICE AND OPTICAL DEVICE INCLUDING THE SAME

CROSS-REFERENCE TO RELATED APPLICATIONS

This application claims the priority of Korean Patent Application No. 2008-0098637 filed on Oct. 8, 2008, in the Korean Intellectual Property Office, the disclosure of which is incorporated herein by reference.

BACKGROUND OF THE INVENTION

1. Field of the Invention

The present invention relates to a side-view type light emitting device, and more particularly, to a side-view type light emitting device having a structure capable of providing uniform light irradiation on a test target such as a light guide panel (LGP) and an optical device including the side-view type light emitting device.

2. Description of the Related Art

In general, a light emitting diode (LED) is provided as a light emitting device that has a package body with a lead frame connected to an electrode. The light emitting diode is widely used in various application fields, in combination with a variety of light receiving devices such as a backlight unit of a liquid crystal display, a light guide panel of a surface emitting display, and an optical sensor.

Specifically, a side-view type light emitting device (a kind of light emitting device) is widely used as a light source for a backlight unit of a liquid crystal display.

The backlight unit must maintain the light uniformity throughout the entire panel in spite of the trend toward the wide area thereof. However, because an LED light source used as a light source for the backlight unit is a point light source, it has a limitation in the light uniformity in comparison with a conventional CCFL that is a line light source. Also, because the number of LEDs mounted on a circuit board increases with an increase in the BLU area, the positional accuracy of the mounted LEDs must also be secured. However, the tolerance of a reflow soldering process, which is generally used as a mounting process, causes a variation in the position of the LED on an FPCB. Also, a distance change of the light guide panel and the backlight unit and the LED may occur in alignment with the backlight unit.

A method of mounting a light emitting device closely on a light input surface of a light guide panel is used to prevent the above problems. However, when the light guide panel is expanded by the heat generated during the operation of an LED, the distance between the LED and the light guide panel changes or they are closely adhered to each other, thus making it difficult to provide uniform light irradiation.

SUMMARY OF THE INVENTION

An aspect of the present invention provides a side-view type light emitting device that can maintain the amount of light, which is irradiated from a light emitting diode (LED) light source onto a light-receiving device such as a light guide panel (LGP), uniformly regardless of the driving time and the disposing position in order to realize uniform light irradiation.

Another aspect of the present invention provides an optical device including the side-view type light emitting device.

According to an aspect of the present invention, there is provided a side-view type light emitting device including: a package body having a first surface provided as a mounting surface, a second surface located opposite to the first surface, side surfaces located between the first surface and the second surface, and a concave portion formed at one of the side surfaces corresponding to the light emitting surface; first and second lead frames formed at the package body to be exposed to the bottom of the concave portion; a light emitting diode chip mounted on the bottom of the concave portion to be electrically connected to each of the first and second lead frames; a resin covering portion formed in the concave portion to enclose the light emitting diode chip; and at least one spacer portion formed at the side surface around the concave portion to maintain a constant distance from a light irradiation target without reducing the view angle of light emitted from the light emitting diode chip in the major-axis direction of the concave portion.

The spacer portion may be formed adjacent to the edge of the side surface of the package body with the concave portion in such a way as not to reduce the view angle of the emission light.

One of the side surfaces of the spacer portion, which faces the concave portion, may an inclined surface in order not to reduce the view angle of the emission light.

The spacer portion may have a height of about 10 μm to about 500 μm from the surface of the resin covering portion. The spacer portion may have a height of about 10 μm to about 200 μm from the side surface around the concave portion.

The spacer portion may include a plurality of spacers.

The spacers may be formed respectively at both ends of the light emitting surface located in the major-axis direction of the concave portion.

Each of the spacers may have a convex curved surface. The spacers may be formed respectively at both ends of the light emitting surface located in the minor-axis direction of the concave portion. The spacers may be formed to extend in the major-axis direction from both ends of the concave portion in the minor-axis direction of the concave portion.

The at least one spacer unit may be formed along the edge of the side surface of the package body having the concave portion formed therein.

The resin covering portion may contain fluorescent powders for converting the wavelength of light emitted from the light emitting diode chip.

According to another aspect of the present invention, there is provided an optical device including: at least one side-view type light emitting device described above; and a light guide panel having a side surface mounted with the at least one side-view type light emitting device, wherein the spacer portion of the side-view type light emitting device is mounted to contact one side of the light guide panel to maintain a constant distance between the side surface of the light guide panel and the surface of the resin covering portion of the side-view type light emitting device.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
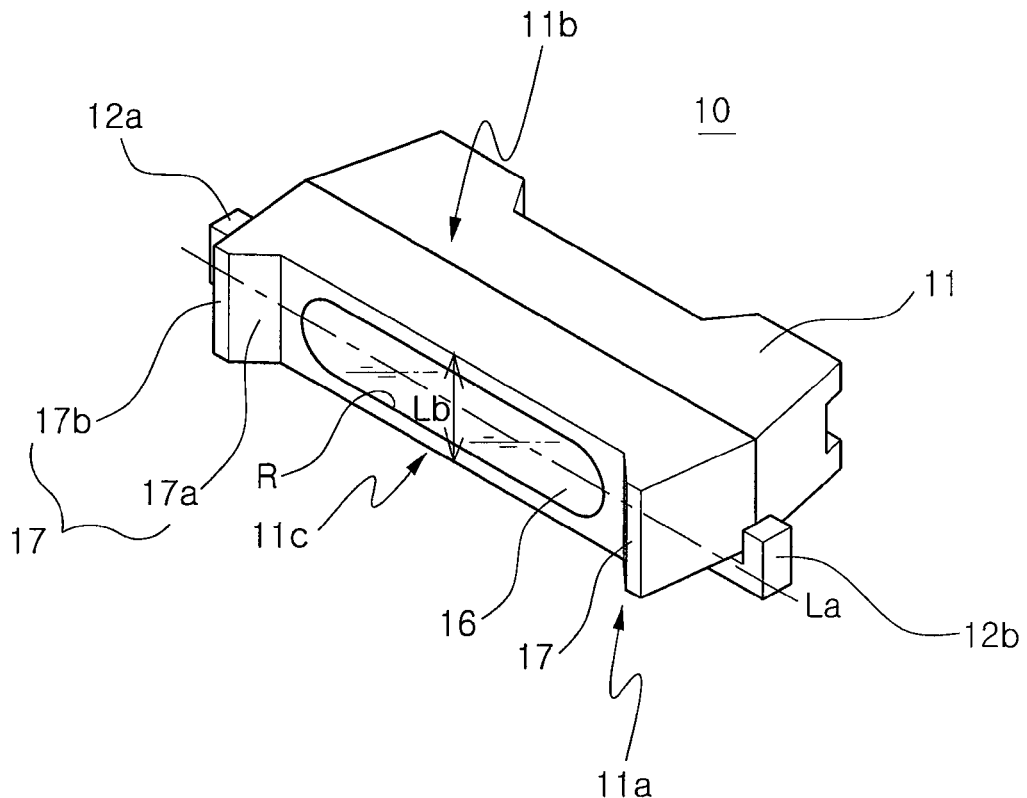
FIGS. 1A and 1B are respectively a perspective view and a side sectional view of a side-view type light emitting device according to an embodiment of the present invention.
Figure 1B:
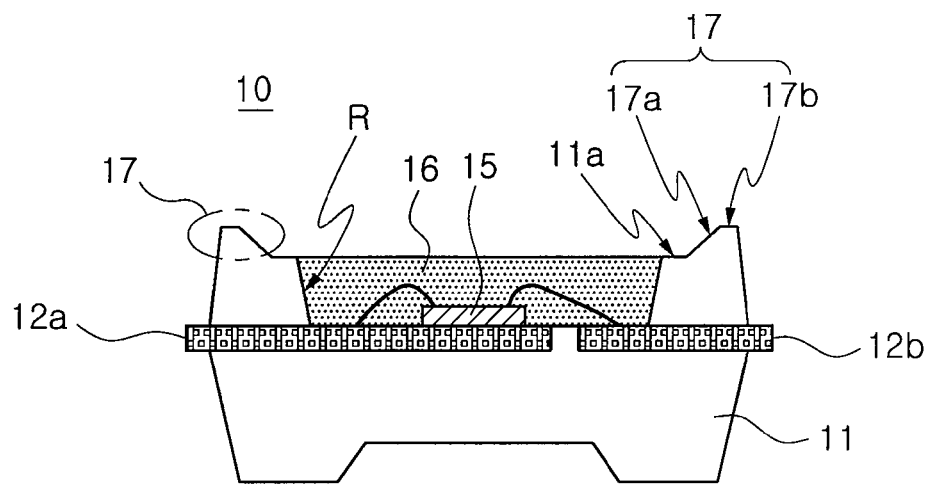

FIGS. 1A and 1B are respectively a perspective view and a side sectional view of a side-view type light emitting device according to an embodiment of the present invention.

Referring to FIGS. 1A and 1B, a side-view type light emitting device 10 according to an embodiment of the present invention includes a package body 11 having a concave portion R, and a light emitting diode chip 15 mounted on the bottom of the concave portion R.

In this embodiment, the package body 11 has a first surface 11a provided as a mounting surface, a second surface 11b located opposite to the first surface 11a, and side surfaces located between the first surface 11a and the second surface 11b. Herein, the concave portion R is formed at one of the side surfaces corresponding to a light emitting surface 11c.

The side-view type light emitting device 10 includes a first lead frame 12a and a second lead frame 12b that are formed at the package body 11 in such a way that they are exposed to the bottom of the concave portion R. The light emitting diode chip 15 is mounted on the bottom of the concave portion R in such a way that it is electrically connected to each of the first and second lead frames 12a and 12b. As shown in FIG. 1B, the light emitting diode chip 15 may be mounted on the first lead frame 12a and an electrode of the light emitting diode chip 15 may be connected by means of a wire. However, the present invention is not limited thereto and the light emitting diode chip 15 may have a variety of well-known connection structures. For example, if the light emitting diode chip has a vertical structure, the lead frame mounting the light emitting diode chip may be electrically connected simultaneously with the mounting.

The side-view type light emitting device 10 includes a resin covering portion 16 that is formed in the concave portion R to enclose the light emitting diode chip 15. The resin covering portion 16 may be formed of a well-known transparent resin. For example, the resin covering portion 16 may be formed of an epoxy resin, a silicon resin, or a mixture thereof. Preferably, the resin covering portion 16 may additionally contain fluorescent powders for wavelength conversion or light scattering powders for light scattering.

The side-view type light emitting device 10 includes a spacer portion 17 that is formed on the side surface around the concave portion R, i.e., the light emitting surface 11c, in such a way that it does not reduce the view angle of light emitted from the light emitting diode chip 15. The spacer portion 17 is provided as a means for maintaining a constant distance from a test target such as a light guide panel.

In this embodiment, the spacer portion 17 is disposed at each end of the light emitting surface 11c of the package body 11 in a major-axis direction of the concave portion R. Specifically, the spacer portion 17 is disposed adjacent to the edge of the light emitting surface 11c so that it does not reduce the view angle of the light.

Also, in this embodiment, the spacer portion 17 may be formed to have an inclined side surface 17a facing the concave portion R, and a top surface 17b contacting a light irradiation target. The inclined side surface 17a can effectively secure the view angle of the light. The preferable range of the view angle of the light will be described later with reference to FIG. 4.

In this specification, the terms "concave portion's major axis La" and "concave portion's minor axis Lb" are respectively used to denote the long-width direction and the short-width direction of the concave portion R. Herein, the major axis La and the minor axis Lb cross each other at right angles.

The operation and effect of the side-view type light emitting device 10 of FIG. 1A will be described below with reference to FIGS. 2A and 2B.

Figure 2A:
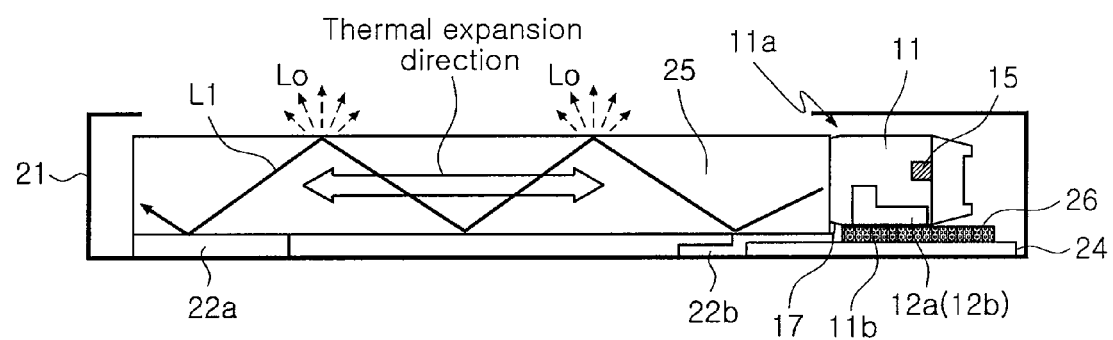
FIGS. 2A and 2B are side sectional views of an optical device having a light guide panel coupled with the side-view type light emitting device of FIG. 1A.
Figure 2B:
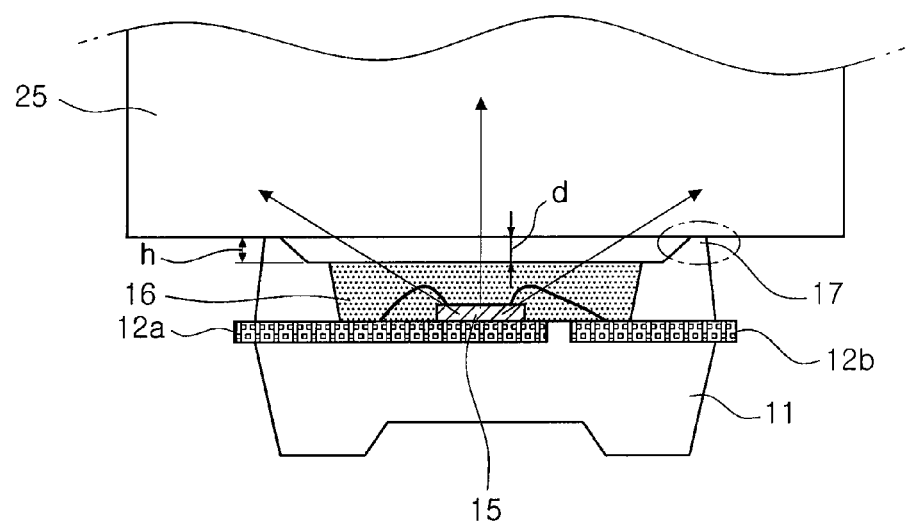

FIGS. 2A and 2B show an example of a backlight unit. Referring to FIGS. 2A and 2B, a light guide panel 25 is connected and attached in a case 21 by means of fixing members 22a and 22b. Under the condition of the close adhesion between the side-view type light emitting device 10 and one side surface of the light guide panel 25 (specifically, the condition of the close adhesion between the light guide panel 25 and the top of the spacer portion 17), the lead frames 12a and 12b of the side-view type light emitting device 10 are fixed on a printed circuit board 24 by means of a joining layer 26 such as soldering. In this manner, the side-view type light emitting device 10 is mounted on the printed circuit board 24 in such a way that it has a predetermined distance d from the light guide panel 25 due to a height h of the spacer portion 17. In this arrangement, light L1 emitted from the side-view type light emitting device 10 is irradiated into the light guide panel 25 and then radiates in a desired direction Lo.

The side-view type light emitting device 10 operates as a heat source while continuing to be driven for a long time, and the resulting heat is transmitted to the light guide panel 25. Therefore, the light guide panel 25 may expand thermally toward the side-view type light emitting device 10. This thermal expansion leads to a change in the distance d between the light guide panel 25 and the side-view type light emitting device 10, causing a change in the light input ratio.

In order to prevent such an undesirable change in the light input rate caused by such a change in the distance d, the spacer portion 17 having a higher contact surface than the resin covering portion 16 is provided to maintain the constant spacing distance d. The fact of being able to prevent a change in the light input rate by maintaining the distance d by means of the spacer portion 17 will be described in detail with reference to FIG. 3.

Figure 3:
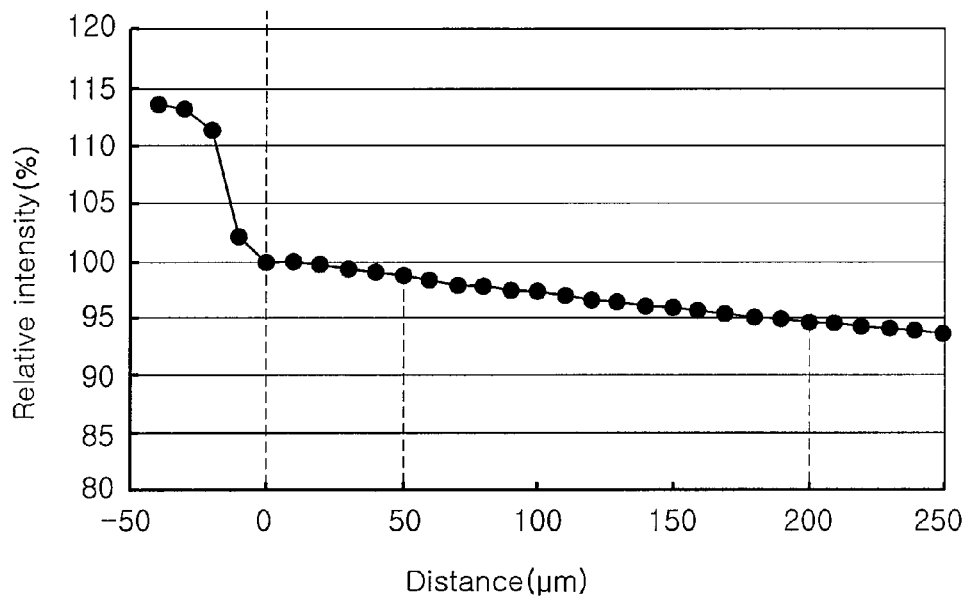
FIG. 3 is a graph illustrating a change in light input efficiency depending on the distance between the side-view type light emitting device and the light guide panel.

FIG. 3 is a graph illustrating a light input rate depending on the distance d between the side-view type light emitting device 10 and the light guide panel 25. Herein, the light input rate is measured indirectly through the brightness measured at a light input portion of the backlight unit.

Referring to FIG. 3, it can be seen that the light input rate increases as a distance d between the surface of the light guide panel 25 and the surface of the resin covering portion 16 of the side-view type light emitting device 10 decreases.

Herein, if the distance d is smaller than 0, that is, if the surface of the resin covering portion 16 is pressed and concaved by the thermally-expanded light guide panel 25, the light input rate increases rapidly. The reason for this is that the light input efficiency is maximized in the completely-adhered state because the encapsulant of the resin covering portion 16 and the light guide panel 25 have a similar refractivity of about 1.4 to 1.55.

Thus, if the light guide panel 25 is closely adhered to the surface of the resin covering portion 16 to mount the side-view type light emitting device 10 on the printed circuit board 24, the light input rate changes greatly due to a change caused by the thermal expansion of the light guide panel 25.

In consideration of this fact, the present invention provides a method of spacing the surface of the resin covering portion 12 of the side-view type light emitting device 10 apart from the light input surface of the light guide panel 25 by use of the spacer portion 17. This spacing makes it possible to prevent a rapid change in the light input rate due to the thermal expansion, for example. Also, it is preferable that the height h of the spacer portion 17 defining the distance between the surface of the resin covering portion 16 and the surface of the light guide panel 25 is set to be within a suitable range capable of achieving a sufficient light input ratio.

Specifically, it can be said to be preferable that the spacer portion 17 of the present invention is set to have a height of about 50 μm to about 200 μm (see the graph of FIG. 3). That is, it is preferable that the spacer portion 17 is set to have a height of about 50 μm or more in order to sufficiently prevent the close adhesion caused by the thermal expansion; and it is preferable that the spacer portion 17 is set to have a height of about 200 μm or less in order to prevent the degradation of the light input rate caused by the excessive distance (in order to maintain a light input rate of at least about 95%).

Figure 4:
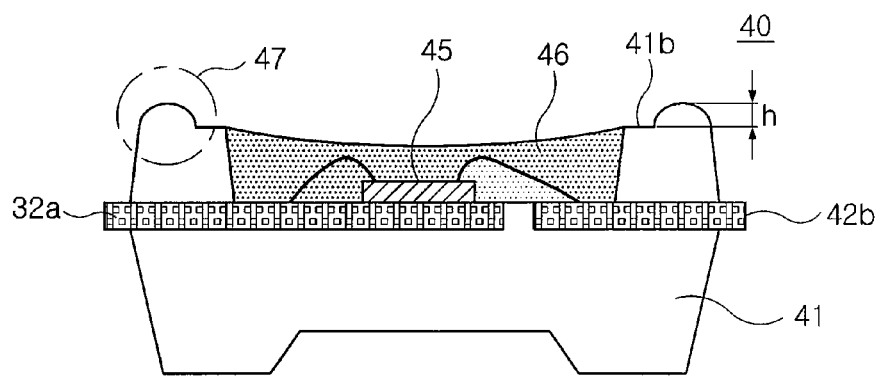
FIG. 4 is a side sectional view of a side-view type light emitting device according to another embodiment of the present invention.

FIG. 4 is a side sectional view of a side-view type light emitting device according to another embodiment of the present invention.

Referring to FIG. 4, a side-view type light emitting device 40 according to another embodiment of the present invention includes a package body 41 having a concave portion, and a light emitting diode chip 45 mounted on the bottom of the concave portion.

The side-view type light emitting device 40 includes a first lead frame 42a and a second lead frame 42b that are formed at the package body 41 in such a way that they are exposed to the bottom of the concave portion. An electrode of the light emitting diode chip 45 is connected electrically to each of the first and second lead frames 42a and 42b by means of a wire. The side-view type light emitting device 40 includes a resin covering portion 46 that is formed in the concave portion to enclose the light emitting diode chip 45.

The package body 41 according to this embodiment is similar to the package body 11 of FIG. 1A. Like the spacer portion 17 of FIG. 1A, a spacer portion 47 is formed on top surface of a light emitting surface around the concave portion in the major-axis direction. The spacer portion 47 has a predetermined height h such that the surface of a resin covering portion is spaced apart from a light irradiation target (e.g., a light guide panel). Unlike the spacer portion 17 of the aforesaid embodiment, the spacer portion 47 may have a convex surface. The spacer portion 47 is disposed adjacent to the edge of the light emitting surface so that it does not reduce the view angle of light emitted from the light emitting diode chip 45.

Figure 5A:
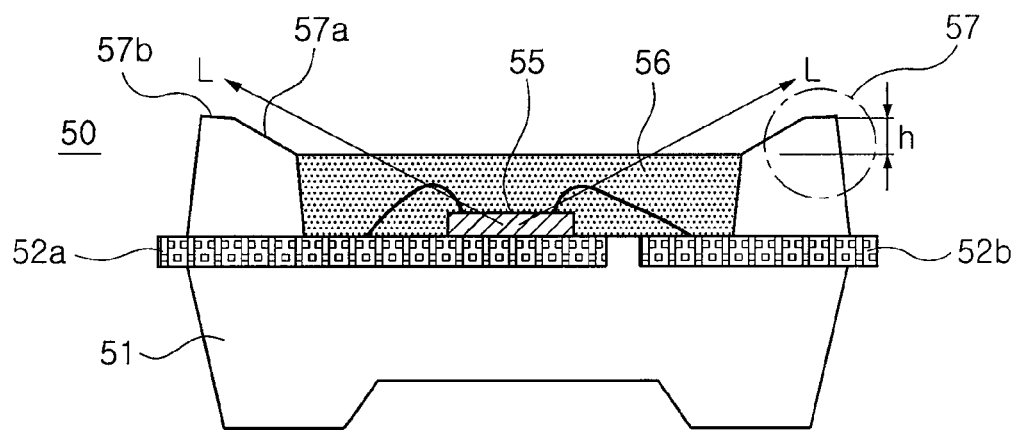
FIGS. 5A and 5B are respectively side sectional views of side-view type light emitting devices according to other embodiments of the present invention.
Figure 5B:
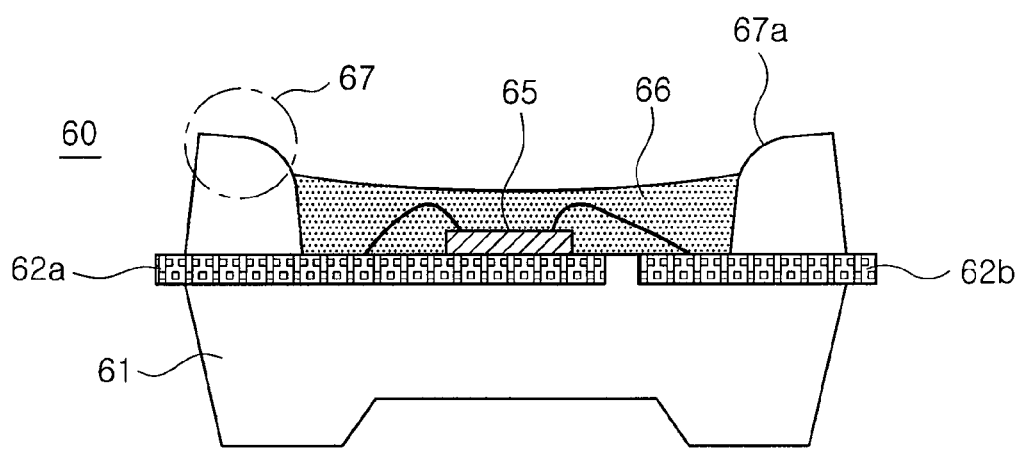

FIGS. 5A and 5B are respectively side sectional views of side-view type light emitting devices according to other embodiments of the present invention. The aforesaid embodiments illustrate that the spacer portion is provided only at a region adjacent to the edge of the each end of the light emitting surface. However, in these embodiments, the entire of a top surface located at each end of a light emitting surface is shaped and provided as a spacer portion.

Referring to FIG. 5A, a side-view type light emitting device 50 according to another embodiment of the present invention includes a package body 51 having a concave portion, and a light emitting diode chip 55 mounted on the bottom of the concave portion. Referring to FIG. 5B, a side-view type light emitting device 60 according to another embodiment of the present invention includes a package body 61 having a concave portion, and a light emitting diode chip 65 mounted on the bottom of the concave portion.

The side-view type light emitting device 50 includes a first lead frame 52a and a second lead frame 52b that are formed at the package body 51 in such a way that they are exposed to the bottom of the concave portion. Likewise, the side-view type light emitting device 60 includes a first lead frame 62a and a second lead frame 62b that are formed at the package body 61 in such a way that they are exposed to the bottom of the concave portion. An electrode of the light emitting diode chip 55 is electrically connected to each of the first and second lead frames 52a and 52b by means of a wire. Likewise, an electrode of the light emitting diode chip 65 is electrically connected to each of the first and second lead frames 62a and 62b by means of a wire. The side-view type light emitting device 50 includes a resin covering portion 56 that is formed in the concave portion to enclose the light emitting diode chip 55. Likewise, the side-view type light emitting device 60 includes a resin covering portion 66 that is formed in the concave portion to enclose the light emitting diode chip 65.

Like the spacer portion 17 of FIG. 1A, each of a spacer portion 57 and a spacer portion 67 according to the embodiments of FIGS. 5A and 5B is formed on a light emitting surface around the concave portion in the major-axis direction. Herein, the spacer portion has a predetermined height h such that the surface of a resin covering portion is spaced apart from a light irradiation target (e.g., a light guide panel).

Unlike the spacer portion of the aforesaid embodiment, the spacer portion 57 of FIG. 5A is formed throughout the top surface of a light emitting surface located in the major-axis direction. That is, the spacer portion 57 according to this embodiment has an inclined surface 57a extending from the resin covering portion 56, and a top surface 57b contacting a light irradiation target. In this manner, by setting a suitable angle of the inclined surface 57a, the specific embodiment can prevent the view angle of light L in the major-axis direction from being reduced, even without limiting the formation position of the spacer portion 57 to the edge.

The spacer portion 67 of FIG. 5B is similar to the spacer portion 57 of FIG. 5A in terms of the formation location and the fact that they are formed by processing the top surface region located at each end. However, the spacer portion 67 of FIG. 5B is different from the spacer portion 57 of FIG. 5A in that it has a gently curved surface. In this case, under the condition of not reducing the light view angle in the major-axis direction, the spacer portion 67 can be satisfactorily used as the spacer portion of the present invention.

Figure 6:
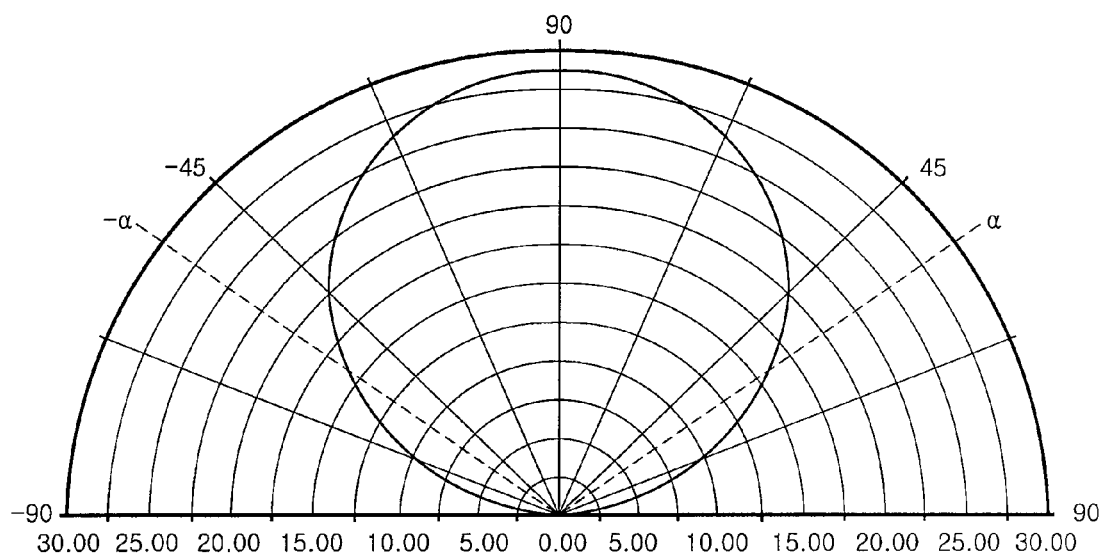
FIG. 6 is a graph illustrating view angle conditions considered in designing a spacer portion used in the present invention.

The condition of not reducing the view angle in the major-axis direction by the spacer portion of the present invention will be described with reference to FIG. 6. FIG. 6 is a graph illustrating a view angle range in the major-axis direction of the side-view type light emitting device. The desirable condition of not reducing the view angle in the major-axis direction by the spacer portion may be defined as the condition of not reducing a view angle ($-\alpha° \sim \alpha°$) that is the angle of outputting light corresponding to a brightness of about 50 (e.g., about 16.5) in comparison with a brightness at a 90° position (e.g., 37 arb.).

Figure 7A:
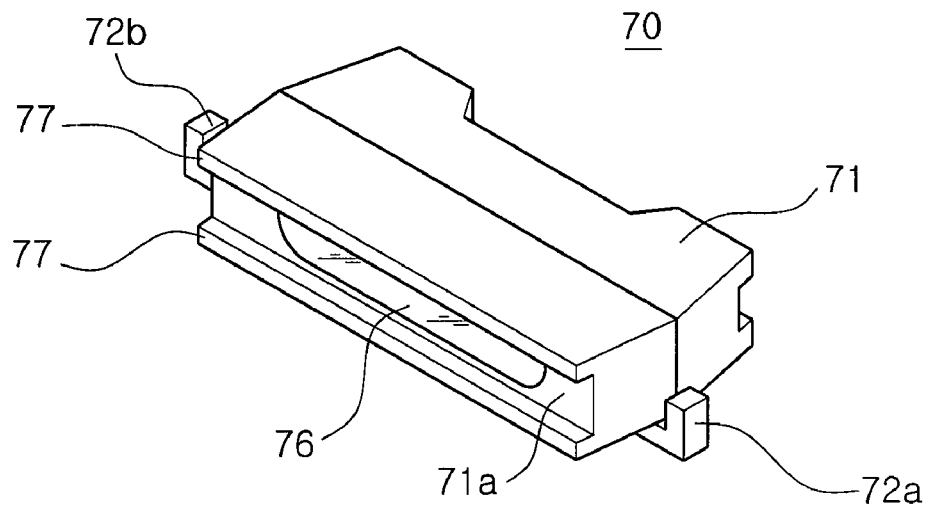
FIGS. 7A and 7B are respectively a perspective view and a sectional view of a side-view type light emitting device according to another embodiment of the present invention.
Figure 7B:
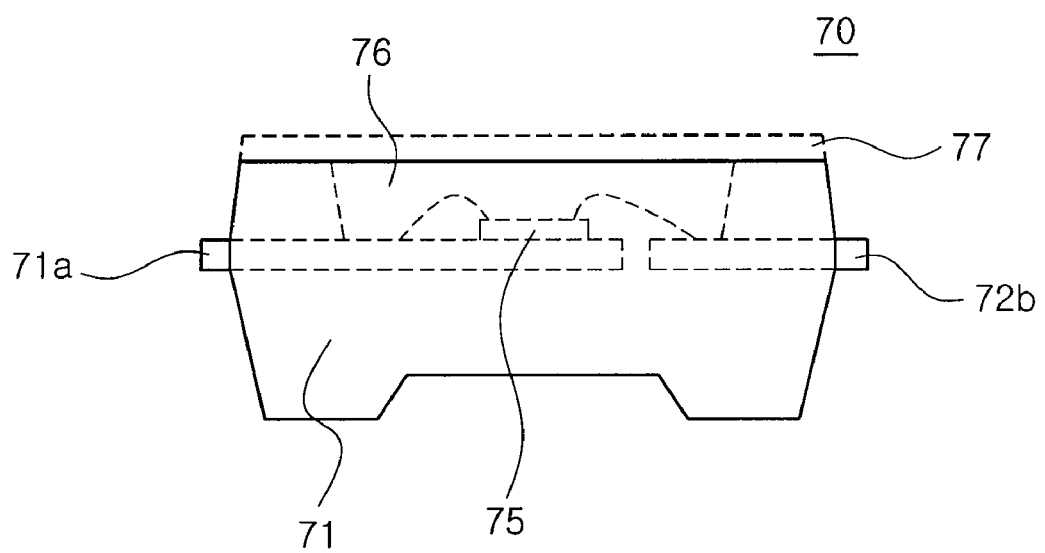

FIGS. 7A and 7B are respectively a perspective view and a sectional view of a side-view type light emitting device according to another embodiment of the present invention.

Referring to FIGS. 7A and 7B, a side-view type light emitting device 70 according to another embodiment of the present invention includes a package body 71 having a concave portion, and a light emitting diode chip 75 mounted on the bottom of the concave portion.

The side-view type light emitting device 70 includes a first lead frame 72a and a second lead frame 72b that are formed at the package body 71 in such a way that they are exposed to the bottom of the concave portion. An electrode of the light emitting diode chip 75 is electrically connected to each of the first and second lead frames 72a and 72b by means of a wire. The side-view type light emitting device 70 includes a resin covering portion 76 that is formed in the concave portion to enclose the light emitting diode chip 75.

A spacer portion 77 formed in the package body 71 has a predetermined height in order to secure a predetermined distance between the surface of the resin covering portion 76 and a light irradiation target (e.g., a light guide panel). However, unlike the aforesaid embodiment, the spacer portion 77 according to this embodiment may be formed at each end of a light emitting surface located in the minor-axis direction of the concave portion.

The problem of the view angle of light emitted from the light emitting diode chip 75 is mainly related to the major-axis direction but is not related to the minor-axis direction. Thus, the spacer portion formed on the top surface satisfies the condition of not reducing a desired view angle, that is, a view angle range in the major-axis direction. Rather, if the view angle is large in the minor-axis direction, the light does not travel into the light guide panel but travels to the outside to disappear. Therefore, the spacer portion 77 formed on the top surface in the minor-axis direction increases the amount of light inputted into the light guide panel, thus increasing the effective optical efficiency.

The package body 71 contains light-reflecting powders such as $TiO_2$ for the light reflecting function of the spacer portion to increase the inherent reflectance of the package body 71, thereby improving the light guiding function of the spacer portion.

The spacer portion 77 is not limited thereto, and may be formed to extend in the major-axis direction along the edge of the top portion. The extended spacer portion can provide a more stable support.

Figure 8A:
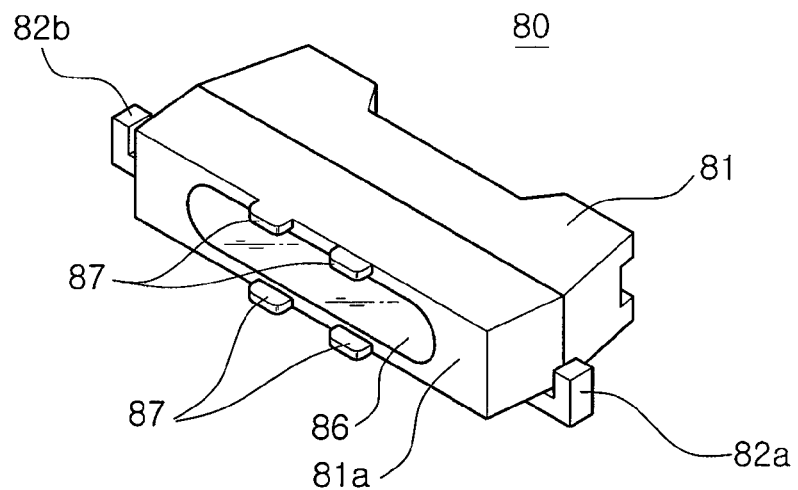
FIGS. 8A and 8B are respectively a perspective view and a sectional view of a side-view type light emitting device according to another embodiment of the present invention.
Figure 8B:
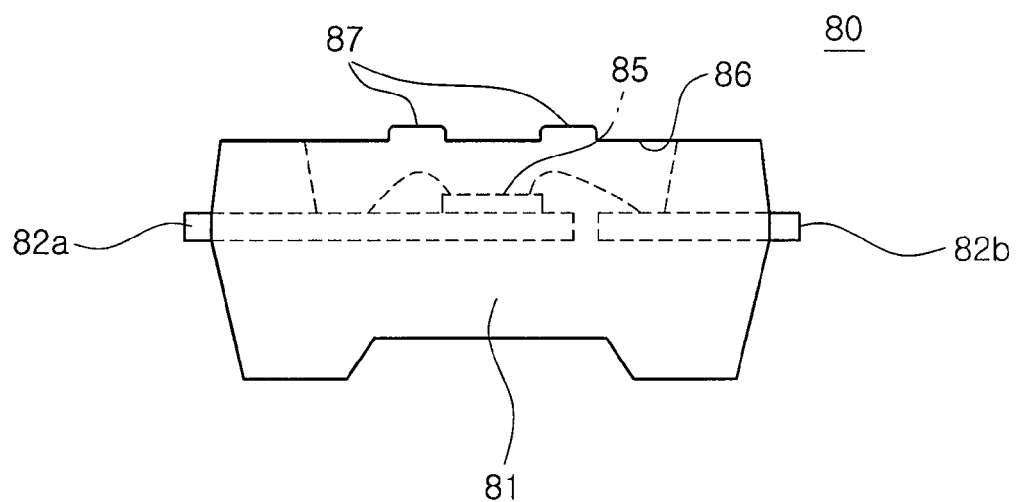

FIGS. 8A and 8B are respectively a perspective view and a sectional view of a side-view type light emitting device according to another embodiment of the present invention.

Referring to FIGS. 8A and 8B, a side-view type light emitting device 80 according to another embodiment of the present invention includes a package body 81 having a concave portion, and a light emitting diode chip 85 mounted on the bottom of the concave portion. The package body 81 includes a first lead frame 82a and a second lead frame 82b that are electrically connected to the electrodes of the light emitting diode chip 85.

Also, the side-view type light emitting device 80 includes a resin covering portion 86 that is formed in the concave portion to enclose the light emitting diode chip 85.

The spacer portion 87 according to this embodiment is formed at the top surface of a light emitting surface in the minor-axis direction of the concave portion, like in the embodiment of FIG. 7A, but a plurality of spacer portions may be arranged at the edges of the respective top surfaces in the major-axis direction.

Figure 9:
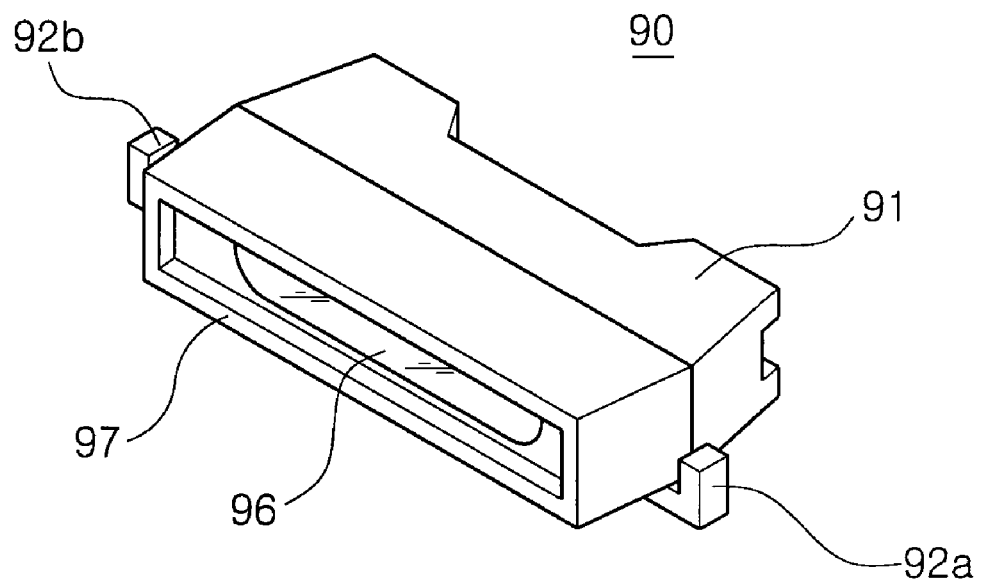
FIG. 9 is a perspective view of a side-view type light emitting device according to another embodiment of the present invention.

FIG. 9 is a perspective view of a side-view type light emitting device according to another embodiment of the present invention.

Referring to FIG. 9, a side-view type light emitting device 90 according to another embodiment of the present invention includes a package body 91 having a concave portion, and a light emitting diode chip mounted on the bottom of the concave portion. The package body 91 includes a first lead frame 92a and a second lead frame 92b. Also, the side-view type light emitting device 90 includes a resin covering portion 96 that is formed in the concave portion to enclose the light emitting diode chip 95.

A spacer portion 97 according to this embodiment is formed throughout the edge of the top surface of a light emitting surface in the minor-axis direction of the concave portion, like in the embodiment of FIG. 7A, and is extended to the edge of the top surface in the major-axis direction to provide a single spacer unit. As described above, the spacer portion located at the top surface in the minor-axis direction does not cause the degradation of the desired view angle, but rather increases the light input rate in a light guide panel. The spacer portion located in the major-axis direction is formed in a region adjacent to the edge in such a way that it does not reduce the light view angle.

Figure 10:
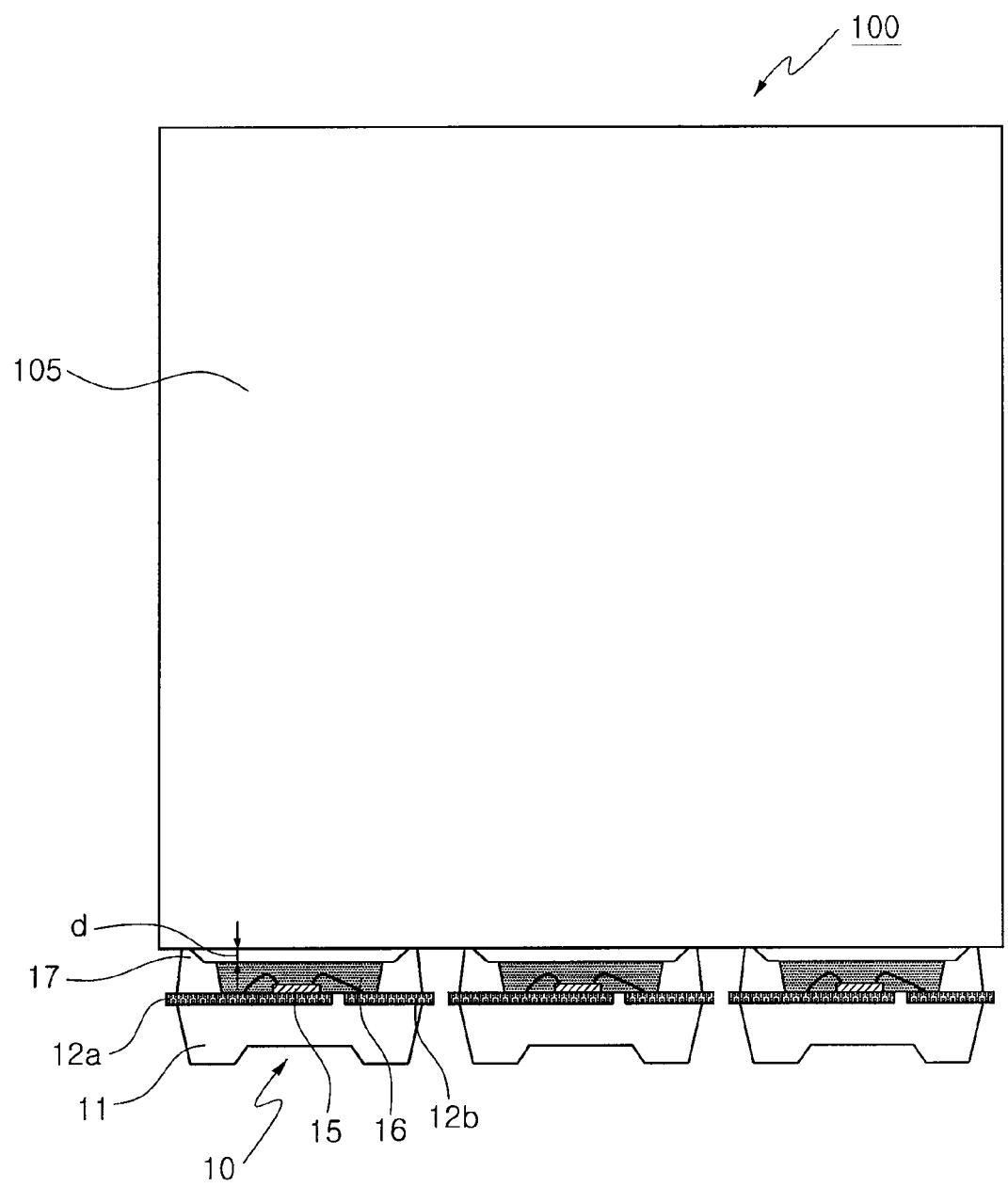
FIG. 10 is a sectional view of an optical device having a light guide panel coupled with the side-view type light emitting device of FIG. 1A.

FIG. 10 is a sectional view of an optical device having a light guide panel coupled with the side-view type light emitting device of FIG. 1A. An optical device 100 of FIG. 10 may be used as a backlight unit of a liquid crystal display.

Referring to FIG. 10, the optical device 100 includes a light guide panel 105 (i.e., a light irradiation target), and three side-view type light emitting devices 10 adhered closely to the light input surface of the light guide panel 105.

In each of the side-view type light emitting devices 10, the spacer portion 17 contacts the light input surface of the light guide panel 105 in such a way that one side of the light guide panel 105 and the surface of the resin covering portion 16 of the side-view type light emitting device maintain a constant distance d therebetween. Accordingly, even when the light guide panel 105 expands thermally, the distance d can be maintained, thus preventing a change in the light input rate. Also, even when the distance d changes somewhat, it does not cause the close adhesion of the surface of the resin covering portion, thus preventing a large change in the light input rate.

Figure 11:
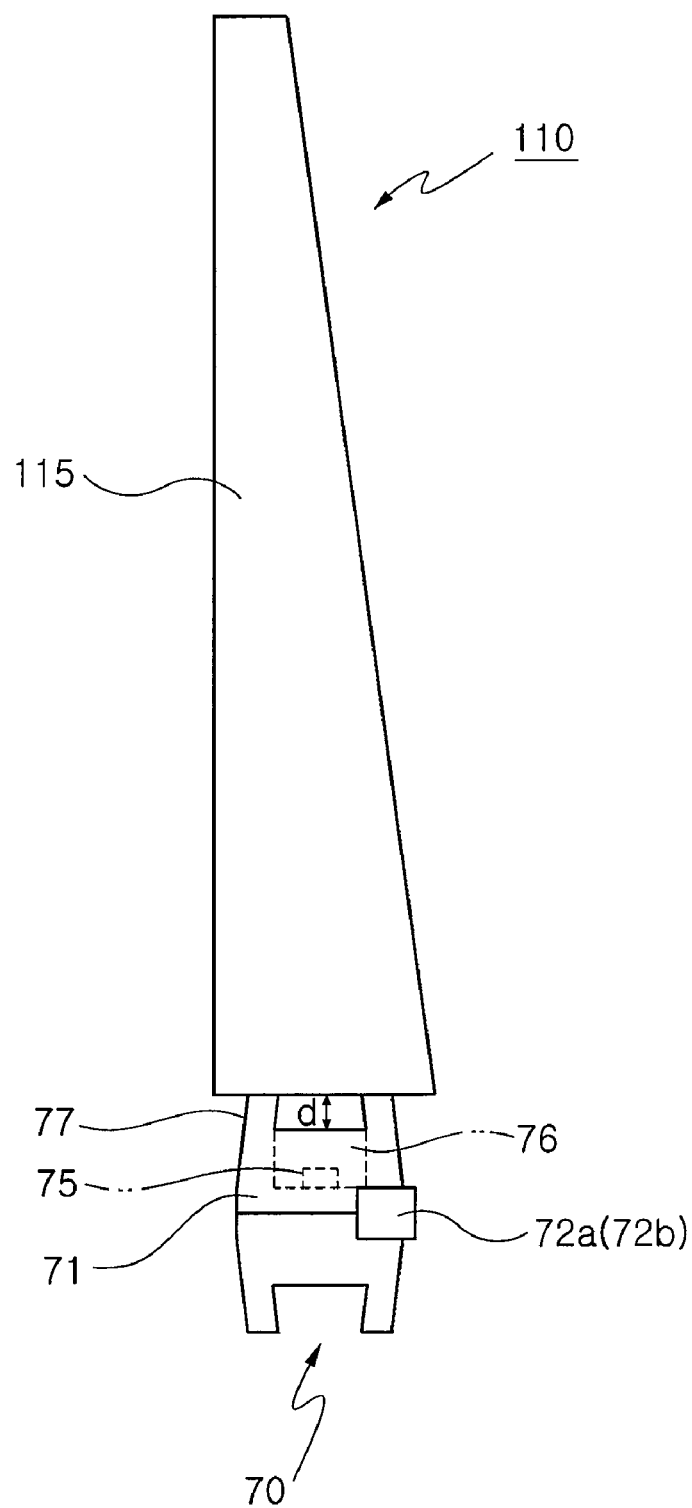
FIG. 11 is a sectional view of an optical device having a light guide panel coupled with the side-view type light emitting device of FIG. 7A.

FIG. 11 is a sectional view of an optical device having a light guide panel coupled with the side-view type light emitting device of FIG. 7A. An optical device 110 of FIG. 11 may be used as a backlight unit of a liquid crystal display.

Referring to FIG. 11, the optical device 110 includes a light guide panel 115, and a plurality of side-view type light emitting devices 70 adhered closely to the light input surface of the light guide panel 115.

In each of the side-view type light emitting devices 70, the spacer portion 17 contacts the light input surface of the light guide panel 115 in such a way that one side of the light guide panel 115 and the surface of the resin covering portion 76 of the side-view type light emitting device maintain a constant distance d therebetween. Accordingly, a change in the light input rate can be reduced even when the light guide panel 105 expands thermally. Also, the light, which may disappear in the minor-axis direction, is guided into the light guide panel, thus increasing the light efficiency.

As described above, the present invention not only can maintain the amount of light, which is irradiated from the LED light source onto the light-receiving device such as the light guide panel, uniformly regardless of the driving time and the disposing position in order to realize uniform light irradiation, but also can maintain the light input efficiency by not reducing the view angle in a desired direction. Furthermore, in the specific embodiment, the spacer portion is located at the top surface in the minor-axis direction, thereby making it possible to increase the light input efficiency of the light irradiation target.

While the present invention has been shown and described in connection with the exemplary embodiments, it will be apparent to those skilled in the art that modifications and variations can be made without departing from the spirit and scope of the invention as defined by the appended claims.

What is claimed is:

1. A side-view type light emitting device comprising:
   a package body having a first surface provided as a mounting surface, a second surface located opposite to the first surface, side surfaces located between the first surface and the second surface, and a concave portion formed at one of the side surfaces corresponding to the light emitting surface;
   first and second lead frames formed at the package body to be exposed to the bottom of the concave portion;
   a light emitting diode chip mounted on the bottom of the concave portion to be electrically connected to each of the first and second lead frames;
   a resin covering portion formed in the concave portion to enclose the light emitting diode chip; and
   at least one spacer portion formed at the side surface around the concave portion to maintain a constant distance from a light irradiation target without reducing the view angle of light emitted from the light emitting diode chip in the major-axis direction of the concave portion.

2. The side-view type light emitting device of claim 1, wherein the spacer portion is formed adjacent to the outer edge of the light emitting surface.

3. The side-view type light emitting device of claim 1, wherein one of the side surfaces of the spacer portion, which faces the concave portion, is an inclined surface.

4. The side-view type light emitting device of claim 1, wherein the spacer portion has a height of 10 μm to 500 μm from the surface of the resin covering portion.

5. The side-view type light emitting device of claim 4, wherein the spacer portion has a height of 10 μm to 200 μm from the side surface around the concave portion.

6. The side-view type light emitting device of claim 1, wherein the spacer portion comprises a plurality of spacers.

7. The side-view type light emitting device of claim 6, wherein the spacers are formed respectively at both ends of the light emitting surface located in the major-axis direction of the concave portion.

8. The side-view type light emitting device of claim 7, wherein each of the spacers has a convex curved surface.

9. The side-view type light emitting device of claim 6, wherein the spacers are formed respectively at both ends of the light emitting surface located in the minor-axis direction of the concave portion.

10. The side-view type light emitting device of claim 9, wherein the spacers are formed in pairs respectively at both ends of the light emitting surface located in the minor-axis direction of the concave portion.

11. The side-view type light emitting device of claim 10, wherein the spacers formed respectively at both ends of the light emitting surface are arranged in the major-axis direction of the concave portion.

12. The side-view type light emitting device of claim 9, wherein the spacers are formed to extend in the major-axis direction from both ends of the light emitting surface located in the minor-axis direction of the concave portion.

13. The side-view type light emitting device of claim 1, wherein the at least one spacer portion is formed along the edge of the side surface of the package body having the concave portion formed therein.

14. The side-view type light emitting device of claim 1, wherein the resin covering portion contains fluorescent powders for converting the wavelength of light emitted from the light emitting diode chip.

15. An optical device comprising:
   at least one side-view type light emitting device according to claim 1; and
   a light guide panel having one side surface mounted with the at least one side-view type light emitting device,
   wherein the spacer portion of the side-view type light emitting device is mounted to contact one side of the light guide panel to maintain a constant distance between the side surface of the light guide panel and the surface of the resin covering portion of the side-view type light emitting device.

* * * * *